VARIABLE-CAPACITANCE POINT CONTACT DIODE

Filed March 13, 1963

2 Sheets-Sheet 1

INVENTORS
SHOICHI KITA
HISASHI WATANABE
BY Hopgood & Calimafde
ATTORNEYS

VARIABLE-CAPACITANCE POINT CONTACT DIODE

Filed March 13, 1963 2 Sheets-Sheet 2

INVENTORS
SHOICHI KITA
HISASHI WATANABE
BY Haggard & Calimafde
ATTORNEYS

United States Patent Office 3,305,710

Patented Feb. 21, 1967

3,305,710
VARIABLE-CAPACITANCE POINT CONTACT DIODE

Shoichi Kita and Hisashi Watanabe, Tokyo, Japan, assignors to Nippon Telegraph and Telephone Public Corporation, Tokyo, Japan, and Nippon Electric Company Limited, Tokyo, Japan, both corporations of Japan Filed Mar. 13, 1963, Ser. No. 264,983
Claims priority, application Japan, Mar. 29, 1962, 37/12,394
1 Claim. (Cl. 317—236)

This invention relates in general to semiconductor diodes and in particular to semiconductor diodes which have variable capacitance. More particularly, this invention is an improvement in semiconductor diodes such as described in Japanese Patent No. 280,896, which discloses a point-contact semiconductor diode made of N-type germanium and a silver whisker containing at least one element from group III of the periodic table.

One object of this invention is to provide a variable-capacitance semiconductor diode which has improved characteristics over those heretofore known in the art.

Other objects of this invention will be apparent to those skilled in the art from the following description of one specific embodiment thereof, as illustrated in the attached drawings, in which.

Figure 1A:
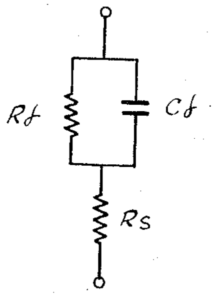
FIG. 1A is a first equivalent circuit for a back-biased semiconductor diode.
Figure 1B:
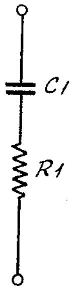
FIG. 1B is a second equivalent circuit for a back-biased semiconductor diode.

As a variable capacitance element, a semiconductor diode is generally biased in the backward direction. In this case, the equivalent circuit of the semiconductor diode shown in FIG. 1A can be transformed into the equivalent circuit shown in FIG. 1B by means of the following equations:

(1)
$$R_1=R_s+\frac{R_j}{1+(\omega C_j R_j)^2}$$

and (2)
$$C_1=C_j+\frac{1}{(\omega C_j R_j)^2}$$

while the quality factor Q of the semiconductor diode is given by (3)
$$Q=\frac{1}{\omega C_1 R_1}$$

where $R_s$, and $R_j$, $C_j$, and $\omega$ represent series resistance, junction resistance, junction capacitance of the diode, and angular frequency, respectively.

The junction resistance $R_j$ of a semiconductor diode is very high in general. At high frequencies, therefore, the product $\omega C_j R_j$ becomes considerably larger than unity, with the result that the resistance $R_1$ and capacitance $C_1$ approach the series resistance $R_s$ and the junction capacitance $C_j$, respectively. Therefore, the Equation 3 may be approximately replaced by the following formula:

(4)
$$Q=\frac{1}{\omega C_j R_s}$$

Figure 2:
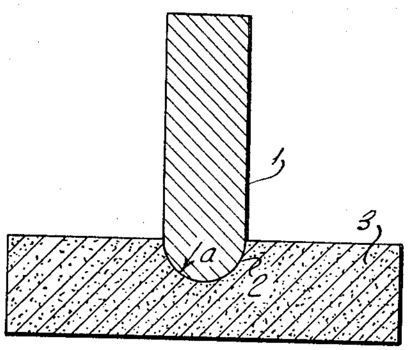
FIG. 2 is an elevation view of a typical diode having a spherical junction.

Referring to FIG. 2, which shows a simple spherical junction as an example of construction of junctions and for calculating the junction capacitance $C_j$ and the series resistance $R_s$, element 1 is a metal wire of diameter $2a$, element 2 is a spherical p-n junction surface of radius $a$, and element 3 is a semiconductor crystal. The junction capacitance $C_j$ and the series resistance $R_s$ of the illustrated construction are given by (5)
$$C_j=2\pi a^2 C$$

and (6)
$$R_s=\rho/2\pi a$$

respectively, where C is the capacitance per unit area of the junction and is a function of the bias voltage, and $\rho$ is the specific resistance of the semiconductor crystal. Therefore, (7)
$$C_j R_s=a\rho C$$

Figure 3:
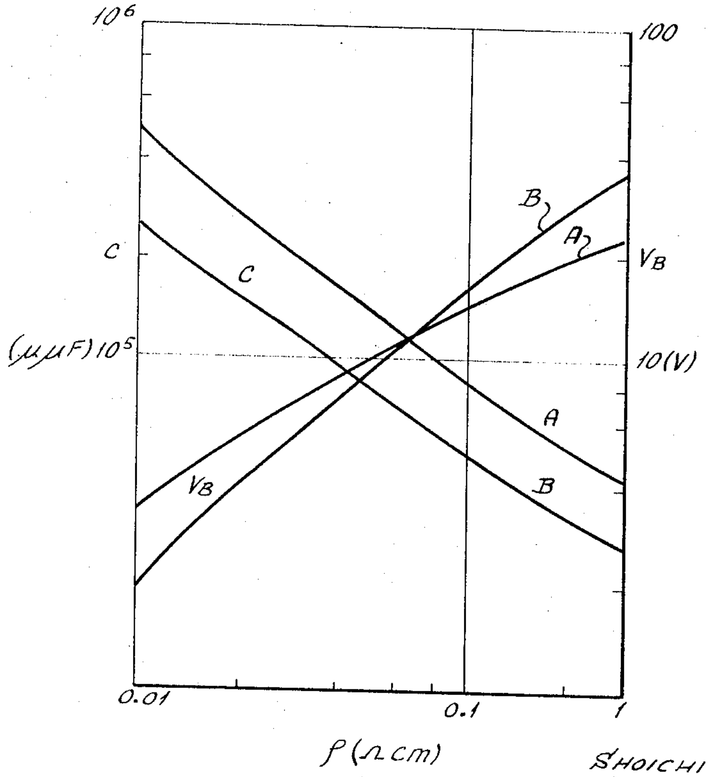
FIG. 3 shows the relation between the resistivities of crystals used in this invention and in a conventional germanium diode, and also the breakdown voltages and capacitance of the junction formed from the crystals.

Referring to FIG. 3, the relations are shown, by curves A for the n-type silicon and by curve B for n-type germanium, between the specific resistance $\rho$ and the capacitance C at zero bias on the one hand, and the breakdown voltage $V_B$ on the other hand. From FIG. 3 and with reference to the Equations 5 and 6, it will be seen that in a low breakdown voltage diode whose breakdown voltage is less than about 11 volts, the series resistance $R_s$ and the junction capacitance $C_j$ of an n-type silicon junction having a certain breakdown voltage are smaller and greater, respectively, than those of an n-type germanium diode having the same breakdown voltage. With this fact in mind and with reference to the Equations 4 and 7, it will be understood that the quality factor Q of the n-type silicon diode, which is a function of the specific resistance, becomes at lower specific resistance as high as that of the n-type germanium diode. While one of the advantages of the diode of the class resides in the fact that capacitance and the quality factor is very small and high, respectively, the n-type germanium diode has a capacitance of about 0.1 $\mu\mu f$ at zero bias and consequently has very low efficiency as a variable-capacitance element at frequencies lower than several thousand megacycles. In contrast, a silicon diode of the same quality factor is about 0.2–0.3 $\mu\mu f$.

Furthermore the fact that silicon has wider width of the forbidden band than germanium results both in higher built-in voltage for forward direction and in higher backward resistance. The silicon diode is therefore preferably used in a low-noise variable-reactance amplifier because noise caused by leakage current is reduced, operation adjacent the zero bias where capacitance change is great is possible, and high efficiency is obtainable in effect. Incidentally, another advantage of a silicon diode is the fact that it is operable at higher temperatures than the germanium diode.

Figure 4:
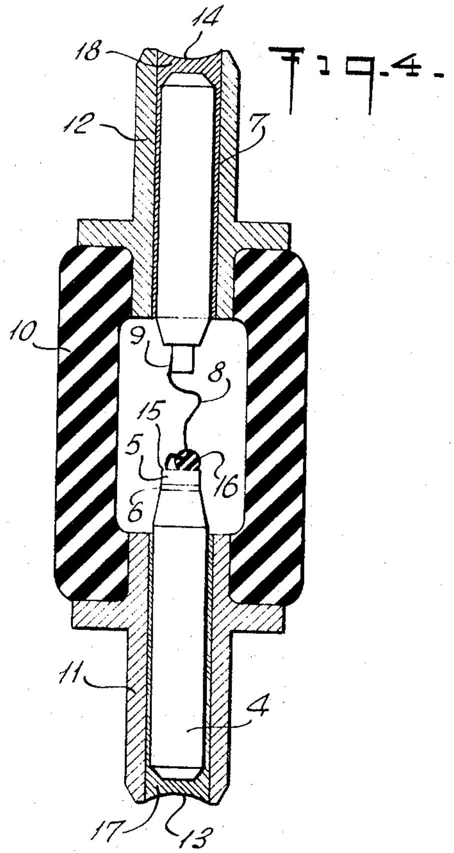
FIG. 4 is a longitudinal sectional view of a semiconductor diode of this invention.

As an example of constructions of semiconductor diodes of the invention, a longitudinal section of a semiconductor diode is shown in FIG. 4 wherein 4 is a metal electrode on the surface of which a chip of n-type silicon single crystal 5 of the resistivity of 0.02 ohm-cm. is attached with a layer 6 of gold foil solder containing a small quantity of antimony or other Group V element. Alternatively, the chip of single crystal 5 may be mounted on the electrode 4 by electroplating nickel-rhodium copper, or the like on the back surface of the chip of single crystal 5 and then by soldering the two. It is necessary in a variable-capacitance element and other low-resistance elements, that such mounting requires great care so that any increase in the series resistance $R_s$ may not result.

Upon an opposing electrode 7, a preformed silver wire 8 having a diameter of 50 microns and containing 5% gallium is welded at a point 9. Both electrodes 4 and 7 are put into a case composed of an insulator tube 10 and opposing tubular electrodes 11 and 12 spaced in places by the insulator tube 10, through openings 13 and 14 on both ends, so that the single crystal 5 and the silver wire 8 may be brought into point contact with each other at a point 15 and at the same time a portion of the silver wire 8 may be fixed in relation to the single crystal 5 at the neighborhood of the point 15 with a drop 16 of an insulating binder.

The assembled diode is subject to discharge therethrough of the electric charge stored in a capacitor of the order of 1 $\mu\mu f$ so as to cause formation of the junction and to stabilize the characteristics. The charge is adjustable with the voltage impressed on the capacitor. The discharging operation is repeated with the voltage gradually increased, until the diode acquires sufficiently favorable nonlinearity. Finally, the openings 13 and 14 in the outward electrodes 11 and 12 are sealed with masses 17 and 18 of solder to complete the diode.

Figure 5:
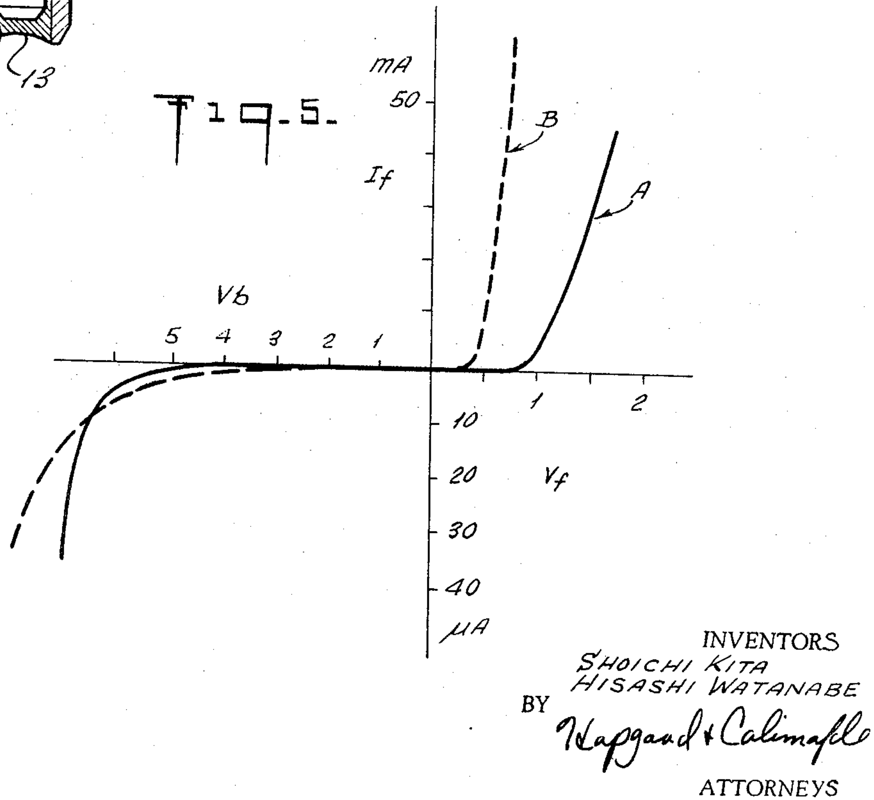
FIG. 5 shows current versus voltage characteristics for a diode of this invention and a prior art germanium diode.

In FIG. 5, the current-voltage characteristics of a silicon diode of the invention are shown by a curve A together with those of an n-type germanium diode shown by another curve B for comparison. As seen from FIG. 5, wherein $I_f$, $V_f$, $I_b$, and $V_b$ represent the forward current, the forward voltage, the backward current, and the backward voltage, respectively, the curve A of the silicon diode has both high voltage at which the forward current increases and less leakage current in the backward direction and accordingly gives considerably higher resistance at the neighborhood of zero bias as compared with the curve B of the germanium diode.

Figure 6:
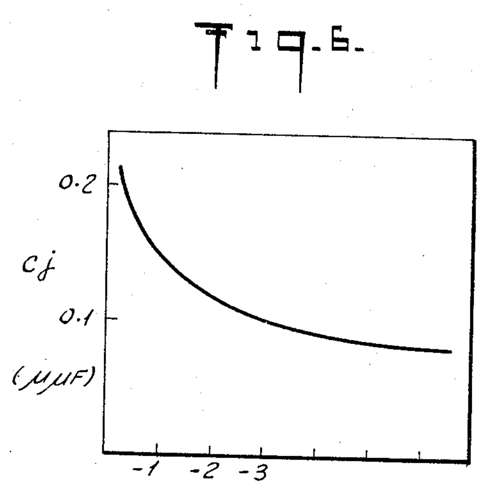
FIG. 6 shows the change of junction capacitance for a diode of this invention with change in the backward bias voltage.

Referring to FIG. 6, which shows the change in the capacity of a silicon diode of the invention with change in the backward bias voltage, it will be understood that inasmuch as the diode is a sort of stepwise p-n junction, it has a large rate of capacity change and particularly large rate of change at the adjacency of zero bias.

From the foregoing description it will be clear that this invention provides a variable-capacitance semiconductor diode which has improved characteristics over those heretofore known in the art. And it should be understood that this invention is by no means limited to the specific structures disclosed herein by way of example, since many modifications can be made in the disclosed structure without departing from the basic teaching of this patent application. Therefore, this invention includes all modifications falling within the scope of the following claim.

What is claimed is:

A variable capacitance semiconductor diode comprising:

a first large diameter electrode, a metallic layer on said electrode, said layer being selected from one of the group comprising gold, copper and nickel-rhodium, a crystal of n-type silicon mounted on said metallic layer, said crystal having a resistivity less than one ohm per centimeter, a second large diameter electrode held in spaced relationship with respect to said first electrode, a silver alloy wire connected to said second electrode, said wire including approximately 5% gallium, said wire further being in selected point contact with a surface of said crystal, a p-n junction being formed at said point contact between said wire and said crystal, said junction having an abrupt voltage-current characteristic, said wire having a bend therein adjacent the point of contact with said crystal, a small mass of insulator binder material secured to said crystal and to said wire in the region of said bend for reliably maintaining the selected contact between said wire and said crystal, means for sealing said diode, and said diode having in the region of zero bias the improved characteristic of higher resistance and a higher rate of capacitance change than similar prior art devices.

References Cited by the Examiner

UNITED STATES PATENTS

| | | | |
|---|---|---|---|
| 2,504,628 | 4/1950 | Benzer | 317—235 |
| 2,552,052 | 5/1951 | Matare | 317—236 |
| 2,588,008 | 3/1952 | Jones et al. | 317—236 |
| 2,909,453 | 10/1959 | Losco et al. | 317—235 |
| 2,989,650 | 6/1961 | Doucette et al. | 317—234 |
| 2,970,248 | 1/1961 | Sahagun | 317—236 |
| 2,987,658 | 6/1961 | Messenger | 317—236 |
| 3,012,174 | 12/1961 | Kita | 317—236 |
| 3,180,766 | 4/1965 | Williams | 148—33 |

JOHN W. HUCKERT, *Primary Examiner.*

J. D. KALLAM, C. E. PUGH, R. SANDLER, *Assistant Examiners.*